US012757779B2

(12) United States Patent
Zhang

(10) Patent No.: US 12,757,779 B2

(45) Date of Patent: Oct. 6, 2026

(54) SEMICONDUCTOR PACKAGE INCLUDING PREFORMED SUPPORT STRUCTURE

(71) Applicant: SAMSUNG ELECTRONICS CO., LTD., Suwon-si (KR)

(72) Inventor: Peng Zhang, Suzhou Industrial Park (CN)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 393 days.

(21) Appl. No.: 18/372,355

(22) Filed: Sep. 25, 2023

(65) Prior Publication Data

US 2024/0153835 A1 May 9, 2024

(30) Foreign Application Priority Data

Nov. 3, 2022 (CN) ......................... 202211368668.2

(51) Int. Cl.

*H10W 74/10* (2026.01)
*H10W 72/00* (2026.01)

(Continued)

(52) U.S. Cl.

CPC ........ *H10W 74/117* (2026.01); *H10W 74/016* (2026.01); *H10W 90/00* (2026.01);

(Continued)

(58) Field of Classification Search

CPC . H01L 23/49816; H01L 23/043; H01L 23/16; H01L 23/293; H01L 24/13;

(Continued)

(56) References Cited

U.S. PATENT DOCUMENTS 8,269,351 B2 9/2012 Wang et al.
9,299,685 B2 3/2016 Kim (Continued)

FOREIGN PATENT DOCUMENTS

CN 103633076 A 3/2014
CN 111868924 A 10/2020

(Continued)

OTHER PUBLICATIONS

US 11,171,130 B2, 11/2021, Arifeen et al. (withdrawn)

(Continued)

*Primary Examiner* — Marc-Anthony Armand

(74) *Attorney, Agent, or Firm* — Sughrue Mion, PLLC

(57) ABSTRACT

Provided is a semiconductor package including a preformed support structure. The semiconductor package includes a substrate, the preformed support structure provided on the substrate, the preformed support structure including a first chip encapsulated with a first molding material, a plurality of second chips, at least one of the second chips being provided on the preformed support structure, and a third chip provided on the second chips, wherein the first chip has a first size, each of the second chips has a second size, the third chip has a third size, and the first size is smaller than the second size and the third size, and wherein a top surface of the at least one of the second chips is at the same height level as top surfaces of other ones of the second chips.

20 Claims, 4 Drawing Sheets

100

(51) Int. Cl.
*H10W 74/01* (2026.01)
*H10W 90/00* (2026.01)

(52) U.S. Cl.
CPC ...... *H10W 72/0198* (2026.01); *H10W 90/722* (2026.01); *H10W 90/724* (2026.01)

(58) Field of Classification Search
CPC ..... H01L 24/73; H01L 25/50; H01L 25/0652; H10W 72/851; H10W 72/20; H10W 90/288; H10W 90/701; H10W 90/20; H10W 76/13; H10W 76/40; H10W 74/47
See application file for complete search history.

(56) References Cited

U.S. PATENT DOCUMENTS

| | | | | |
|---|---|---|---|---|
| 9,793,217 | B2 | 10/2017 | Lee et al. | |
| 9,935,087 | B2 | 4/2018 | Zhai et al. | |
| 11,164,805 | B2 | 11/2021 | Kim et al. | |
| 2013/0049221 | A1* | 2/2013 | Han .................... | H10W 74/121 257/E23.116 |
| 2013/0147062 | A1 | 6/2013 | Lee et al. | |
| 2015/0108657 | A1 | 4/2015 | Kim | |
| 2019/0164888 | A1 | 5/2019 | Chang Chien et al. | |
| 2019/0355659 | A1 | 11/2019 | O'Sullivan et al. | |
| 2019/0385977 | A1* | 12/2019 | Elsherbini ............. | H10W 90/00 |

FOREIGN PATENT DOCUMENTS

| | | | |
|---|---|---|---|
| CN | 112435968 | A | 3/2021 |
| KR | 10-2006-0005722 | A | 1/2006 |

OTHER PUBLICATIONS

Communication dated May 14, 2026 issued by the China National Intellectual Property Administration in Chinese Patent Application No. 202211368668.2.

* cited by examiner

SEMICONDUCTOR PACKAGE INCLUDING PREFORMED SUPPORT STRUCTURE

CROSS-REFERENCE TO RELATED APPLICATION

This application is based on and claims priority under 35 U.S.C. § 119 to the Chinese Patent Application No. 202211368668.2 filed on Nov. 3, 2022, in the Chinese Intellectual Property Office, the disclosure of which is incorporated by reference herein in its entirety.

BACKGROUND

1. Field

Example embodiments of the disclosure relate to the field of semiconductor packages, and in particular, to a semiconductor package including a preformed support structure.

2. Description of the Related Art

An Embedded Multi-Chip Package (eMCP) is a memory standard for smart electronics, which is packaged by combining an embedded Multi-Media Card (eMMC) and a Multi-Chip Package (MCP). The eMCP has a built-in NAND Flash control chip, and as such, the burden in operation of a main chip may be reduced, and a flash memory having a relatively high capacity may be managed. In other words, the eMCP packages an eMMC and an Low-Power Double Data Rate (LPDDR) as integrity, thereby decreasing the volume while reducing the circuit design. Also, the eMCP integrates a main control chip and an NAND Flash into integrity, and manages the Flash by an internal control chip.

FIG. 1 illustrates an eMCP package structure according to the related art. As illustrated in FIG. 1, the eMCP package structure includes an NAND FLASH chip (hereinafter referred to as a flash chip) 1, a DRAM chip (hereinafter referred to as a memory chip) 2 and a control chip (hereinafter referred to as a controller chip) 3. The controller chip 3 is placed at a bottom position of the eMCP package structure due to its relatively smaller size. To ensure that a large-size chip on the controller chip 3 has good structural and electrical properties and reliability while being installed, dummy chips are usually placed around the controller chip 3 as spacers to support an upper chip.

In particular, after the installation of the controller chip 3 at a bottom layer is completed, dummy chips 4 with a certain area are installed around the controller chip 3. Then, the memory chip 2 is installed on an expanded area constituted of the controller chip 3 and the dummy chips 4. Especially, for preventing a difference in height from occurring between the controller chip 3 and the dummy chips 4, a dummy chip 5 having an area no less than that of the memory chip 2 is usually added onto the expanded area constituted of the controller chip 3 and the dummy chips 4, and then the memory chip 2 is installed on an expanded area provided by the dummy chip 5. In addition, for a region of the substrate in which the controller chip 3 is not provided, a dummy chip 6 of a large size may be used to compensate for a difference in height between a memory chip 2A within the region and the memory chip 2, and the flash chip 1 is installed on an expanded area constituted of the memory chips 2 and 2A.

The above eMCP package structure in FIG. 1 requires a lot of dummy chips to be used as spacers, such that the turnaround average time (TAT) of the assembly engineering is long and the production efficiency is low. As the difference in height occurs between upper surfaces of chips arranged side-by-side, there is a risk of cracking when the upper chip is directly installed.

SUMMARY

Example embodiments of the disclosure disclose a semiconductor package including a preformed support structure encapsulated with a molding material to expand a supporting area thereof for an upper chip.

According to an aspect of the disclosure, there is provided a semiconductor package, including: a substrate; a support structure provided on the substrate, the support structure including a first chip encapsulated with a first molding material; a plurality of second chips, at least one of the plurality of second chips being provided on the support structure; and a third chip provided on the plurality of second chips, wherein the first chip has a first size, each of the plurality of second chips has a second size, the third chip has a third size, wherein the first size is smaller than the second size and the third size, and wherein a top surface of the at least one of the plurality of second chips is at a same height level as top surfaces of other ones of the plurality of second chips.

The support structure may further include a plurality of bumps provided on an active surface of the first chip, and an under-fill material provided between the plurality of bumps and the substrate, wherein the first chip is connected to a circuit pattern of the substrate through the plurality of bumps.

The first molding material may cover the first chip to form a first expanded area, the at least one of the plurality of second chips being provided on the first expanded area.

The third size may be greater than the second size.

The first expanded area may be equal to or greater than an occupied area of the third chip.

The semiconductor package may further include a dummy chip provided on the substrate and spaced apart from the support structure, the other ones of the plurality of second chips being provided on the dummy chip.

A top surface of the dummy chip may be at a same height level as a top surface of the support structure.

The first expanded area may be equal to or greater than an occupied area of the at least one of the plurality of second chips.

The first chip may include a controller chip, the plurality of second chips may include memory chips, and the third chip may include a flash chip.

The semiconductor package may further include a second molding material encapsulating the support structure, the second chips, and the third chip.

The support structure may be a preformed support structure.

According to another aspect of the disclosure, there is provided a semiconductor package, including: a substrate; a support structure provided on the substrate, the support structure comprising a first chip encapsulated with a first molding material; one or more second chips provided on the support structure; and a third chip provided on the one or more second chips, wherein the first chip has a first size, each of the one or more second chips has a second size, the third chip has a third size, and wherein the first size is smaller than the second size.

A first second chip, among the one or more second chips, may be provided on the support structure, and wherein a second second chip, among the one or more second chips, may be provided on the support structure.

A top surface of the first second chip may be at a same height level as a top surface of the second second chip.

A first second chip, among the one or more second chips, may be provided on the support structure, and wherein a dummy chip may be provided on the support structure.

A top surface of the first second chip may be at a same height level as a top surface of the dummy chip.

The first size may be smaller than the third size.

The first molding material may cover the first chip to form a first expanded area, and wherein the one or more second chips is provided on the first expanded area.

The first expanded area may be equal to or greater than an occupied area of the third chip.

The first expanded area may be equal to or greater than an occupied area of the one or more second chips.

BRIEF DESCRIPTION OF THE DRAWINGS

Features and advantages of the above and other aspects of the disclosure will become apparent from the following detailed description of example embodiments thereof, taken in conjunction with the accompanying drawings. In the drawings, like reference numerals will denote like elements throughout.

DETAILED DESCRIPTION

Figure 1:
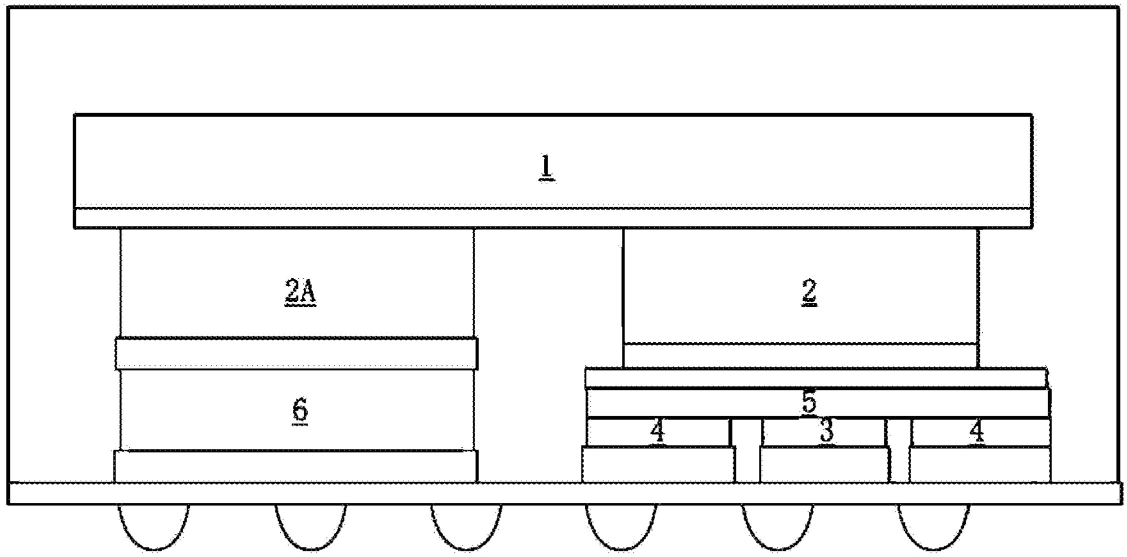
FIG. 1 illustrates an eMCP package structure according to the related art.

Hereinafter, various embodiments of the present disclosure will be described more fully with reference to the drawings, in which certain embodiments are illustrated. However, the present disclosure may be embodied in many different forms, and should not be interpreted as being limited to the embodiments set forth herein. Rather, these embodiments are provided such that the description will be thorough and complete, and will convey the scope of the present disclosure to those skilled in the art. In the drawings, sizes of layers and regions may be exaggerated for sake of clarity.

For ease of description, spatially relative terms, such as "beneath," "below," "lower," "above," "upper," and the like, may be used herein to describe one element's relationship to another element(s) as illustrated in the drawings. It will be understood that the spatially relative terms are also intended to encompass different orientations of the device in use or operation, in addition to the orientation(s) depicted in the drawings. For example, if the device in the drawings is turned over, an element described as "below" or "beneath" other elements would then be oriented "above" the other elements. Thus, the term "below" can encompass both an orientation of "above" and "below". The device may be otherwise oriented (e.g., rotated 90 degrees or at other orientations), and the spatially relative descriptors used herein may be interpreted accordingly.

Figure 2:
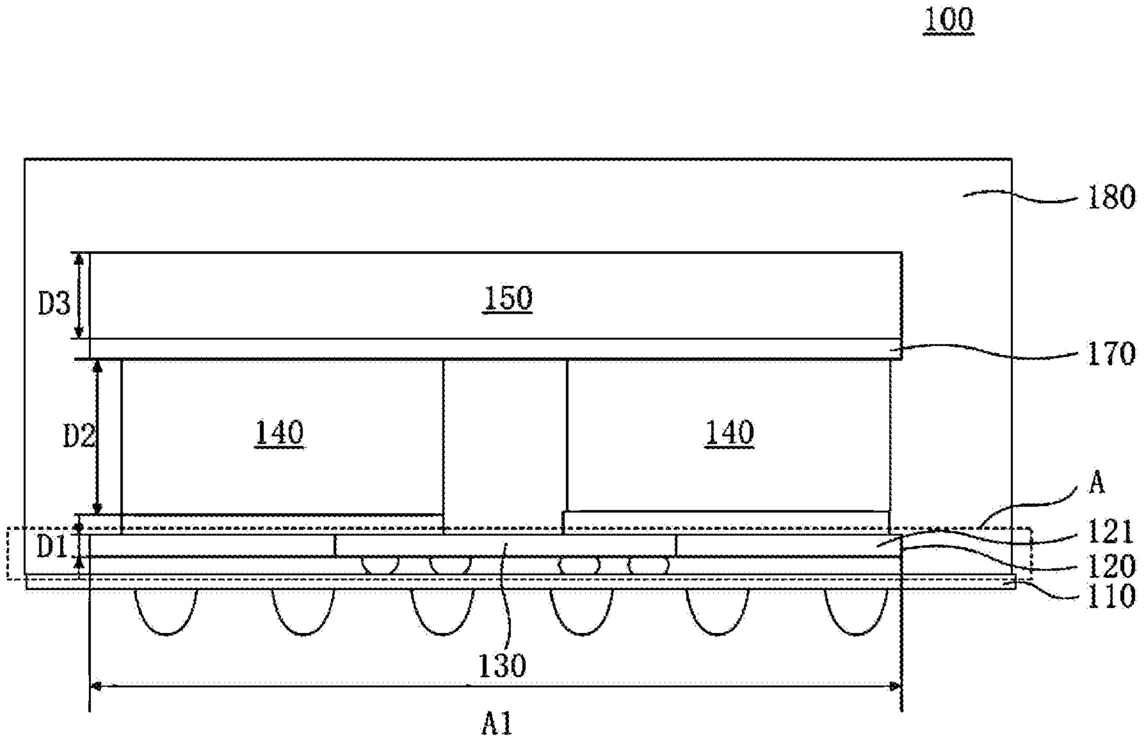
FIG. 2 illustrates a semiconductor package according to an example embodiment of the disclosure.

FIG. 2 illustrates a semiconductor package according to an example embodiment of the disclosure.

As illustrated in FIG. 2, the semiconductor package 100 according to an example embodiment of the disclosure includes a substrate 110, a support structure 120 provided on the substrate 110 and including a first chip 130 encapsulated with a first molding material 121, a plurality of second chips 140, of which at least one is provided on the support structure 120, and a third chip 150 provided on the second chips 140. The support structure 120 may be a preformed support structure.

In an example embodiment, the substrate 110 may be a rigid substrate or a flexible substrate. The substrate 110 may include any material used to form a substrate of a semiconductor package. For example, the substrate 110 may be a printed circuit board with a circuit pattern(s) provided thereon.

The first chip 130 has a first size D1. Each of the second chips 140 has a second size D2. The third chip 150 has a third size D3. The first size D1 is smaller than the second size D2 and the third size D3. In an example embodiment, the first size D1 may include a height of the first chip 130, the second size D2 may include a height of the second chip 140, and the third size D3 may include a height of the third chip 150. For example, the first size D1 may include be a height of the first chip 130, the second size D2 may be a height of the second chip 140, and the third size D3 may be a height of the third chip 150. The height of the first chip 130 is smaller than those of the second and third chips 140 and 150. However, the disclosure is not limited thereto, and the first, second, and third sizes may include at least one of various dimensions, such as lengths, widths, heights, volumes, etc., of the first, second, and third chips, as long as a difference occurring between the first size and the second and third sizes may cause the technical problem intended to be solved by the disclosure.

In an example embodiment, the first chip 130 may be a relatively small chip, and the second and third chips 140 and 150 may be relatively large chips. For example, the first chip 130 may be a relatively small chip as compared to the second and third chips 140 and 150. In a semiconductor package, a relatively small chip is typically provided at the bottom, and relatively large chips are stacked thereon. For ease of continuing to stack multiple relatively large chips in an upper layer, it is required to add dummy chips around the relatively small chip at the bottom as a support structure for the upper chips. This may cause the existence of channels in the semiconductor package structure finally formed, such that the fluidity of a molding material between the chips is deteriorated. In addition, as a certain difference occurs between the heights of various chips of the bottom, the upper chip may be at risk of cracking while being installed.

In the semiconductor package according to an example embodiment of the disclosure, the preformed support structure 120 is provided on the substrate 110 and includes the first chip 130 encapsulated with the first molding material 121, at least one second chip of the second chips 140 is provided on the preformed support structure 120, and the third chip 150 is provided on the second chips 140 such that an upper surface of the at least one second chip is at the same height level as upper surfaces of other (e.g., remaining) second chips of the second chips 140. Since the first chip with the relatively small size, provided at the bottom of the semiconductor package is encapsulated with the molding material, the supporting area of the first chip for the upper chips is expanded, and the dummy chips may be completely omitted, so that the degree of complexity of the semiconductor package structure is reduced, while the above-described issues of the engineering properties and the reliability due to the introduction of multiple dummy chips may be avoided.

Figure 3:
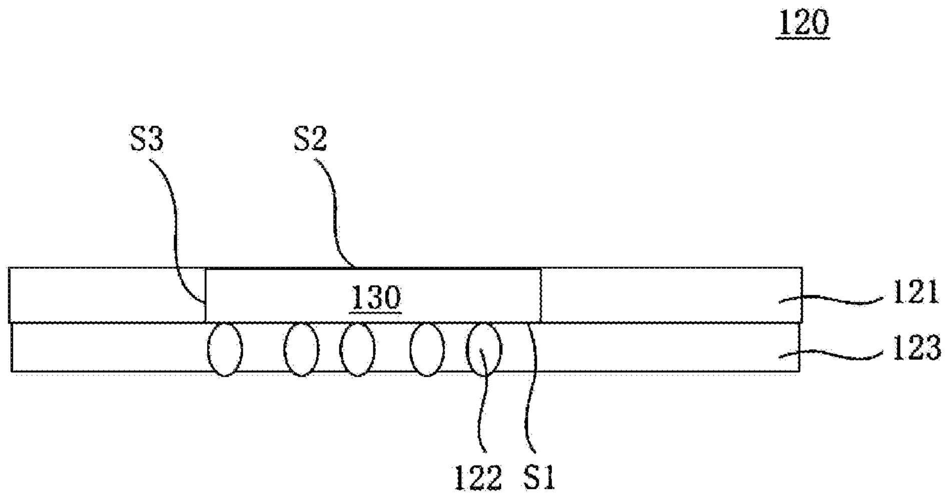
FIG. 3 illustrates an enlarged diagram of a preformed support structure included in the semiconductor package according to the example embodiment of the disclosure, illustrated in a dash-line block A of FIG. 2.

Below, the preformed support structure will be described in detail with reference to FIG. 3. FIG. 3 illustrates an enlarged diagram of a preformed support structure included in the semiconductor package according to the example embodiment of the disclosure, illustrated in a dash-line block of FIG. 2.

As illustrated in FIG. 3, in addition to the first chip 130 and the first molding material 121 encapsulating the first chip 130, the preformed support structure 120 includes a plurality of bumps 122 provided on an active surface S1 of the first chip 130, and an under-fill material 123 provided between the bumps 122 and the substrate 110. The first chip 130 is connected to the circuit patterns of the substrate 110 through the bumps 122.

In an example embodiment, the active surface S1 of the first chip 130 may be a surface with a plurality of conductive pads provided thereon. The bumps 122 may be electrically connected to the conductive pads. The bumps 122 may be formed of metal solder balls. In an example embodiment, the bumps 122 may be melted and connected at corresponding conductive pads positioned on the substrate 110 by a soldering process such as a reflow soldering, so as to be electrically connected to the circuit patterns of the substrate 110. In another example embodiment, the bumps 122 may be connected at corresponding conductive pads positioned on the substrate 110 by a bonding process such as a thermo-compression bonding (TCB), so as to be electrically connected to the circuit patterns of the substrate 110.

In an example embodiment, the under-fill material 123 may be formed of an under-fill resin such as a non-conductive film (NCF) or an underfill. In an embodiment, the first molding material 121 may be formed of a resin molding material such as an epoxy molding compound (EMC), e.g., an epoxy resin. The first molding material 121 may encapsulate an inactive surface S2 of the first chip 130 opposite to the active surface S1. The inactive surface S2 may be a surface without conductive pads provided thereon. A top surface of the first molding material 121 may be at a height (level) higher than the inactive surface S2 of the first chip 130. The first molding material 121 may entirely surround side surfaces S3 of the first chip 130. However, the disclosure is not limited thereto, and the length, the width, and the height of the first molding material 121 may be accordingly adjusted depending on the difference between the size of the first chip and the sizes of the upper chips to be stacked thereon. For example, the top surface of the first molding material may be substantially coplanar with the top surface of the first chip.

In an example embodiment, the first chip 130 illustrated in FIG. 3 may be a flip chip and may have a Fan-out package structure, but the disclosure is not limited thereto, and the first chip may also have a chip-on-board (COB) package structure formed by using a wire bonding process, as long as the preformed support structure thus formed may address to the above technical problem.

Referring back to FIG. 2, in an example embodiment, the first molding material 121 may cover the first chip 130 to form a first expanded area A1, and the second chips 140 may each be provided on the first expanded area A1. The third chip 150 is provided on the second chips 140. The third size D3 of the third chip 150 may be greater than the second size D2 of each of the second chips 140. The first expanded area A1 may be equal to an occupied area of the third chip 150. Here, the term "occupied area" may refer to a footprint area of the third chip in a vertical direction, or may refer to an area of a projection of the third chip along the vertical direction. In some example embodiments, the term "occupied area" may be substantially equal to an area of a bottom surface of the third chip. Although FIG. 2 illustrates that the first expanded area A1 is the same as the occupied area of the third chip 150, the disclosure is not limited thereto, and in other example embodiments, the first expanded area A1 may be greater than the occupied area of the third chip 150. According to another example embodiment, the first expanded area A1 may be less than the occupied area of the third chip 150.

In an example embodiment, the semiconductor package 100 may further include a plurality of adhesive layers 170. The adhesive layers 170 may be provided between the second chips 140 and the preformed support structure 120 and between the third chip 150 and the second chips 140, to adhere these elements to one another.

In an example embodiment, the semiconductor package 100 may further include a second molding material 180. The second molding material 180 may encapsulate the preformed support structure 120, the second chips 140, and the third chip 150. In an embodiment, the second molding material 180 may be an epoxy molding compound, e.g., an epoxy resin, or may be any material commonly used in the art for encapsulating chips.

In the example embodiment, the first chip 130 may include a controller chip, the second chips 140 may include memory chips, and the third chip 150 may include a flash chip. As compared with the memory chips and the flash chip, the controller chip may have a relatively smaller size and is thus placed at the bottom of the package. By encapsulating the controller chip to form a preformed support structure such that the area of the controller chip having the relatively smaller size is effectively expanded, the dummy chips may be completely omitted, thereby avoiding the issues of the engineering properties and the reliability due to the use of dummy chips.

Figure 4:
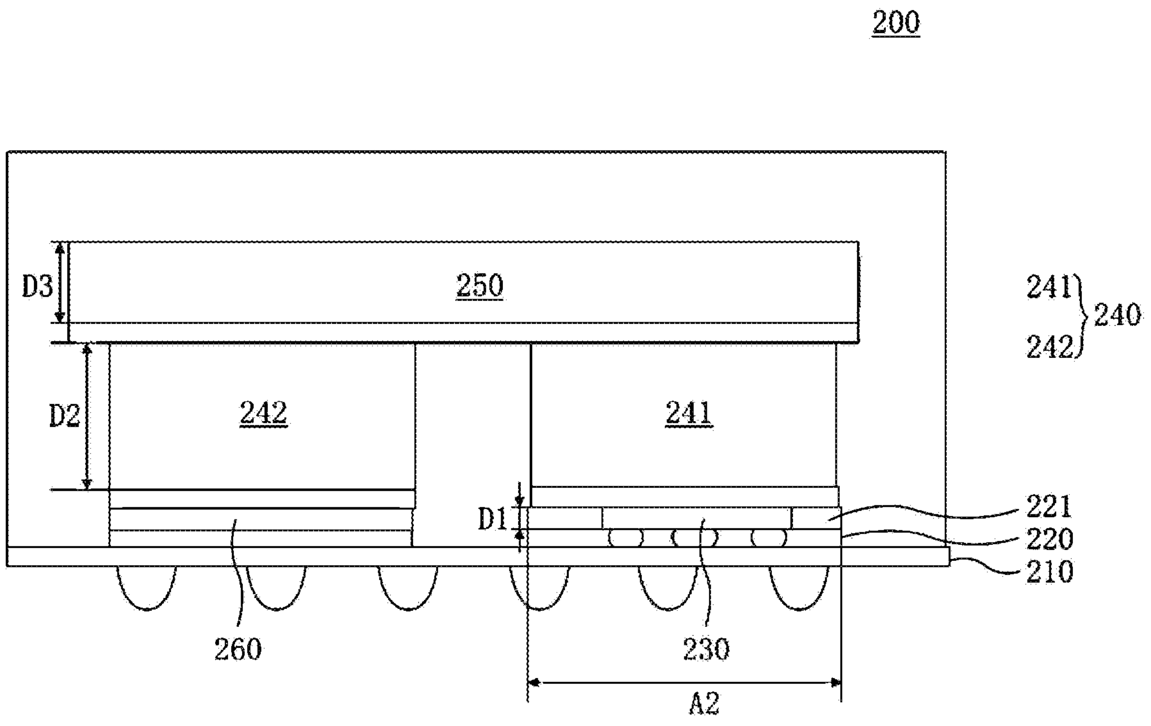
FIG. 4 illustrates a semiconductor package according to an example embodiment of the disclosure.

FIG. 4 illustrates a semiconductor package according to another example embodiment of the disclosure. The semiconductor package illustrated in FIG. 4 is substantially the same as that of FIG. 2 except for a dummy chip and a preformed support structure. Below, the description will be focused on the difference of the second embodiment from the first embodiment.

As illustrated in FIG. 4, the semiconductor package 200 according to the second embodiment of the disclosure includes a substrate 210, a preformed support structure 220 provided on the substrate 210 and including a first chip 230 encapsulated with a first molding material 221, a plurality of second chips 240, of which at least one second chip 241 is provided on the preformed support structure 220, and a third chip 250 provided on the second chips 240.

The semiconductor package 200 may further include a dummy chip 260. The dummy chip 260 may be provided on the substrate 210 and spaced apart from the preformed support structure 220. Another (e.g., remaining) second chip 242 of the second chips 240 is provided on the dummy chip 260.

In an example embodiment, as illustrated in FIG. 4, a first size D1 of the first chip 230 is smaller than a second size D2 of the at least one second chip 241 and a third size D3 of the third chip 250. A top surface of the at least one second chip 241 is at the same height level as a top surface of the remaining second chip 242 of the second chips 240.

In an example embodiment, as illustrated in FIG. 4, a top surface of the dummy chip 260 may be at the same height level as a top surface of the preformed support structure 220. The first molding material 221 may cover the first chip 230 to form a first expanded area A2, and the at least one second chip 241 may be provided on the first expanded area A2. In this example embodiment, the first expanded area A2 may be the same as an occupied area of the at least one second chip 241. However, in other example embodiments, the first expanded area A2 may be greater than the occupied area of the at least one second chip 241.

In the semiconductor package according to the example embodiment of the disclosure, since the first chip with the smaller size, provided at the bottom of the package is encapsulated with the molding material, the supporting area of the first chip for the upper chip is expanded, and the number of the used dummy chips is decreased, so that the degree of complexity of the semiconductor package structure is reduced, while the issues of the engineering properties and the reliability due to the introduction of multiple dummy chips may be avoided.

The example embodiments of the disclosure design, at a bottom of a semiconductor package, a preformed support structure, which may completely or partially replace dummy chips, thereby achieving the improvement of engineering efficiency, and eliminating thoroughly the quality issues of products such as an eMCP, such as cracking of an upper chip, etc., due to a height difference between a plurality of chips.

While the embodiments of the disclosure have been illustrated and described herein, it will be apparent to those skilled in the art that various modifications and variations may be made without departing from the spirit and scope of the disclosure as defined by the appended claims.

What is claimed is:

1. A semiconductor package, comprising:
a substrate;
a support structure provided on the substrate, the support structure comprising a first chip encapsulated with a first molding material;
a plurality of second chips, at least one of the plurality of second chips being provided on the support structure; and
a third chip provided on the plurality of second chips,
wherein the first chip has a first size, a first second chip of the plurality of second chips has a second size, a second second chip of the plurality of second chips has the second size, the third chip has a third size,
wherein the first size is smaller than the second size and the third size, and
wherein a top surface of the at least one of the plurality of second chips is at a same height level as top surfaces of other ones of the plurality of second chips.

2. The semiconductor package as claimed in claim 1, wherein the support structure further comprises:
a plurality of bumps provided on an active surface of the first chip, and
an under-fill material provided between the plurality of bumps,
wherein the first chip is connected to a circuit pattern of the substrate through the plurality of bumps.

3. The semiconductor package as claimed in claim 1, wherein the first molding material covers the first chip to form a first expanded area, the at least one of the plurality of second chips being provided on the first expanded area.

4. The semiconductor package as claimed in claim 3, wherein the third size is greater than the second size.

5. The semiconductor package as claimed in claim 4, wherein the first expanded area is equal to or greater than an occupied area of the third chip.

6. The semiconductor package as claimed in claim 3, further comprising a dummy chip provided on the substrate and spaced apart from the support structure, the other ones of the plurality of second chips being provided on the dummy chip.

7. The semiconductor package as claimed in claim 6, wherein a top surface of the dummy chip is at a same height level as a top surface of the support structure.

8. The semiconductor package as claimed in claim 6, wherein the first expanded area is equal to or greater than an occupied area of the at least one of the plurality of second chips.

9. The semiconductor package as claimed in claim 1, wherein
the first chip comprises a controller chip,
the plurality of second chips comprise memory chips, and
the third chip comprises a flash chip.

10. The semiconductor package as claimed in claim 1, further comprising a second molding material encapsulating the support structure, the plurality of second chips, and the third chip.

11. The semiconductor package as claimed in claim 1, wherein the support structure is a preformed support structure.

12. A semiconductor package, comprising:
a substrate;
a support structure provided on the substrate, the support structure comprising a first chip encapsulated with a first molding material;
a plurality of second chips provided on the support structure; and
a third chip provided on the plurality of second chips,
wherein the first chip has a first size, a first second chip of the plurality of second chips has a second size, a second second chip of the plurality of second chips has the second size, the third chip has a third size, and
wherein the first size is smaller than the second size.

13. The semiconductor package of claim 12,
wherein the first second chip, among the plurality of second chips, is provided on the support structure, and
wherein the second second chip, among the plurality of second chips, is provided on the support structure.

14. The semiconductor package of claim 13,
wherein a top surface of the first second chip is at a same height level as a top surface of the second second chip.

15. The semiconductor package of claim 12,
wherein a first second chip, among the plurality of second chips, is provided on the support structure, and
wherein a dummy chip is provided on the substrate.

16. The semiconductor package of claim 15,
wherein a top surface of the first second chip is at a same height level as a top surface of the dummy chip.

17. The semiconductor package of claim 12, wherein the first size is smaller than the third size.

18. The semiconductor package as claimed in claim 12, wherein the first molding material covers the first chip to form a first expanded area, and
wherein the plurality of second chips is provided on the first expanded area.

19. The semiconductor package as claimed in claim 18, wherein the first expanded area is equal to or greater than an occupied area of the third chip.

20. The semiconductor package as claimed in claim 18, wherein the first expanded area is equal to or greater than an occupied area of the plurality of second chips.

* * * * *